(12) United States Patent
Yokose et al.

(10) Patent No.: US 7,548,175 B2
(45) Date of Patent: Jun. 16, 2009

(54) ENCODING APPARATUS, DECODING APPARATUS, ENCODING METHOD, COMPUTER READABLE MEDIUM STORING PROGRAM THEREOF, AND COMPUTER DATA SIGNAL

(75) Inventors: Taro Yokose, Ashigarakami-gun (JP); Masanori Sekino, Ashigarakami-gun (JP); Tomoki Taniguchi, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/882,672

(22) Filed: Aug. 3, 2007

(65) Prior Publication Data
US 2008/0030384 A1 Feb. 7, 2008

(30) Foreign Application Priority Data
Aug. 7, 2006 (JP) ............................. 2006-214348
Jul. 13, 2007 (JP) ............................. 2007-184219

(51) Int. Cl.
*H03M 7/00* (2006.01)

(52) U.S. Cl. .......................................... 341/59; 341/67
(58) Field of Classification Search ................... 341/50, 341/67, 65, 63, 59; 714/701; 704/223
See application file for complete search history.

(56) References Cited

U.S. PATENT DOCUMENTS

| | | | |
|---|---|---|---|
| 5,764,994 A * | 6/1998 | Craft ........................... | 717/159 |
| 5,905,893 A * | 5/1999 | Worrell ........................ | 717/151 |
| 6,618,506 B1 * | 9/2003 | Auerbach et al. ............ | 382/232 |
| 6,907,598 B2 * | 6/2005 | Fraser .......................... | 717/127 |

FOREIGN PATENT DOCUMENTS

JP A 10-322221 12/1998

* cited by examiner

*Primary Examiner*—Brian Young
(74) *Attorney, Agent, or Firm*—Oliff & Berridge, PLC

(57) ABSTRACT

This invention provides an encoding apparatus including a group generating unit that puts plural information values to be compressed together and generates a group of information values to be compressed; a code assignment unit that assigns a code to each group generated by the group generating unit; and an information encoding unit that encodes the information values to be compressed belonging to each group, using the code assigned to each group.

9 Claims, 14 Drawing Sheets

ENCODING PROGRAM 5

CODE LENGTH

SYMBOL

CODE LENGTH

BLOCK    BLOCK

IMAGE PROCESSING APPARATUS 2

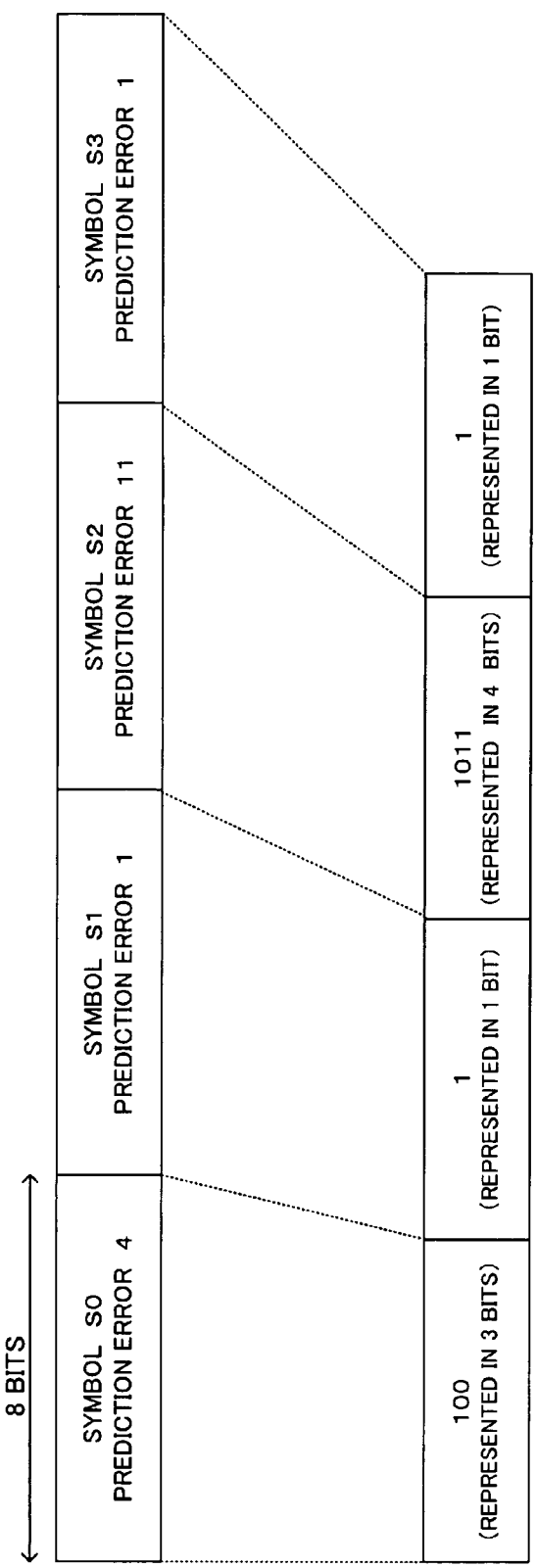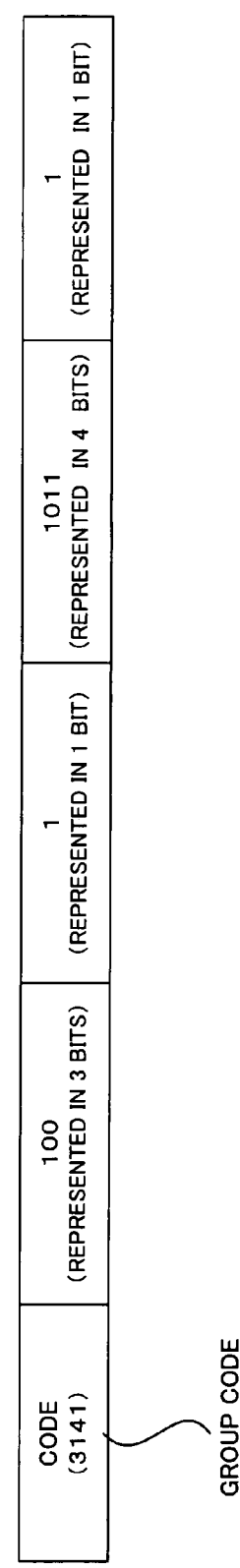

GROUP CODE

| CODE (3141) | 100 (REPRESENTED IN 3 BITS) | 1 (REPRESENTED IN 1 BIT) | 1011 (REPRESENTED IN 5 BITS) | 1 (REPRESENTED IN 1 BIT) |

ENCODING FORMAT INCLUDING MOST SIGNIFICANT BIT

FIG.10B

| CODE (3141) | 00 (REPRESENTED IN 3 BITS) | 011 (REPRESENTED IN 4 BITS) |

ENCODING FORMAT EXCLUDING MOST SIGNIFICANT BIT

FIG. 12

| SYMBOL | | | | | | | | N | CODE |
|---|---|---|---|---|---|---|---|---|---|
| 0 | 1 | 2 | 3 | 4 | 5 | 6 | 7 | | |
| 0 | 0 | 0 | 0 | 0 | 0 | 0 | 0 | 1 | 0x00 |
| 0 | 0 | 0 | 0 | 0 | 0 | 0 | 1 | 1 | 0x01 |
| 0 | 0 | 0 | 0 | 0 | 0 | 0 | 2 | 2 | 0x0002 |
| 0 | 0 | 0 | 0 | 0 | 0 | 0 | 3 | 2 | 0x0003 |
| 0 | 0 | 0 | 0 | 0 | 0 | 1 | 0 | 1 | 0x02 |
| ... | | | | | | | | ... | |
| 3 | 3 | 3 | 3 | 3 | 3 | 3 | 3 | 2 | 0xffff |

CODE TABLE

S30

ENCODING APPARATUS, DECODING APPARATUS, ENCODING METHOD, COMPUTER READABLE MEDIUM STORING PROGRAM THEREOF, AND COMPUTER DATA SIGNAL

CROSS-REFERENCE TO RELATED APPLICATIONS

This application is based on and claims priority under 35 USC 119 from Japanese Patent Application No. 2006-214348 filed Aug. 7, 2006 and Japanese Patent Application No. 2007-184219 filed Jul. 13, 2007.

BACKGROUND

1. Technical Field

The present invention relates to an encoding apparatus, a decoding apparatus, an encoding method, a computer readable medium storing a program thereof, and a computer data signal.

2. Summary

According to an aspect of the present invention, there is provided an encoding apparatus including a group generating unit that puts plural information values together and generates a group of information values; a code assignment unit that assigns a code to each group generated by the group generating unit; and an information encoding unit that encodes the information values belonging to each group, using the code assigned to each group.

BRIEF DESCRIPTION OF THE DRAWINGS

An exemplary embodiment of the present invention will be described in detail based on the following figures, wherein:

FIGS. 4A, 4B, and 4C schematically explain an encoding process by the encoding program 5 (FIG. 3);

FIGS. 10A and 10B schematically explain a manner in which MSBs are removed from the symbols represented in the required numbers of bits;

FIG. 12 illustrates a code table utilized by the table encoding part 710 in FIG. 11;

DETAILED DESCRIPTION

To help understanding of the exemplary embodiment of the present invention, its background and outline are first discussed.

For example, Huffman coding assigns one codeword to each one symbol value; that is, the Huffman coding process gives one output (codeword) to one input (symbol). Here, the symbol is information to be compressed (encoded) by entropy coding. In other words, the term of "information to be compressed" used herein may include symbols to be encoded by entropy coding and, additionally, compressed data (e.g., image data or discrete cosine transform (DCT) coefficients in a JPEG encoding process) before data modeling is performed thereon.

Figure 1A:
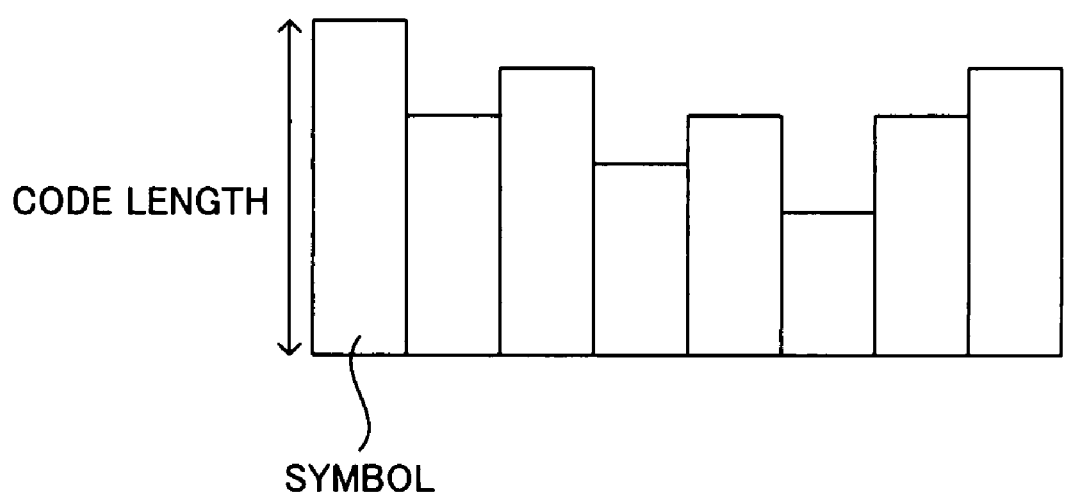
FIG. 1A illustrates encoding in which a code length varies symbol by symbol and FIG. 1B illustrates encoding in which a code length varies block by block, which are shown for comparison.

Such symbol-to-code encoding is easy to configure and design, but code (codeword) length varies symbol by symbol, as illustrated in FIG. 1A.

Although, the term Huffman coding is used for explanatory convenience, the above problem exists in general variable length coding including Huffman coding commonly used for international standard JPEG.

Figure 1B:
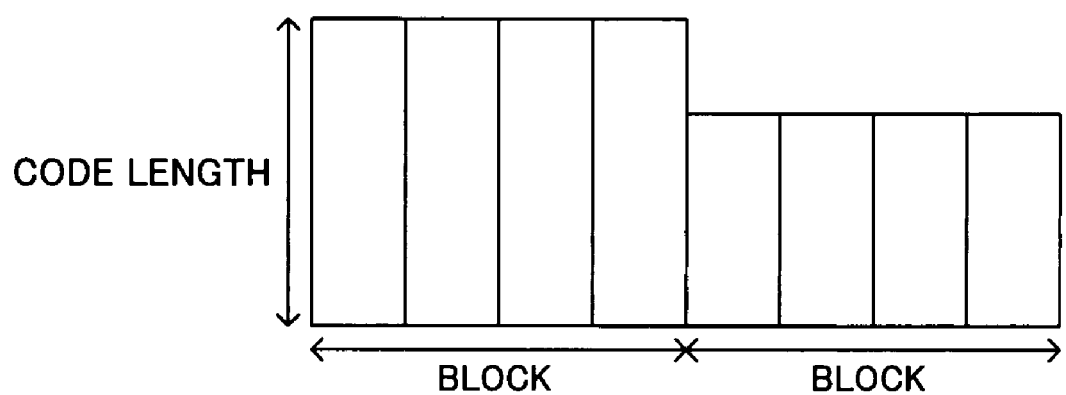

Then, an image processing apparatus 2 in the present exemplary embodiment assigns a codeword to per plural symbols (hereinafter referred to as a block). Specifically, as illustrated in FIG. 1B, one block has codewords with one codeword length, but in terms of symbols, plural symbols are encoded into codewords with one codeword length.

In the present exemplary embodiment, a combination form of an entropy coder that assigns codewords to symbols in units of blocks and a source coder is described by way of example. In this case, however, blocking of the entropy coder does not always need to match blocking of the source coder, and blocking size may be altered because of implementation cost or for other reasons. In some case, however, it may be related to the entropy coder blocking size and the source coder blocking size (e.g., a relationship in which one is a divisor of the other).

[Hardware Structure]

Then, a hardware structure of the image processing apparatus 2 in the present exemplary embodiment is described.

Figure 2:
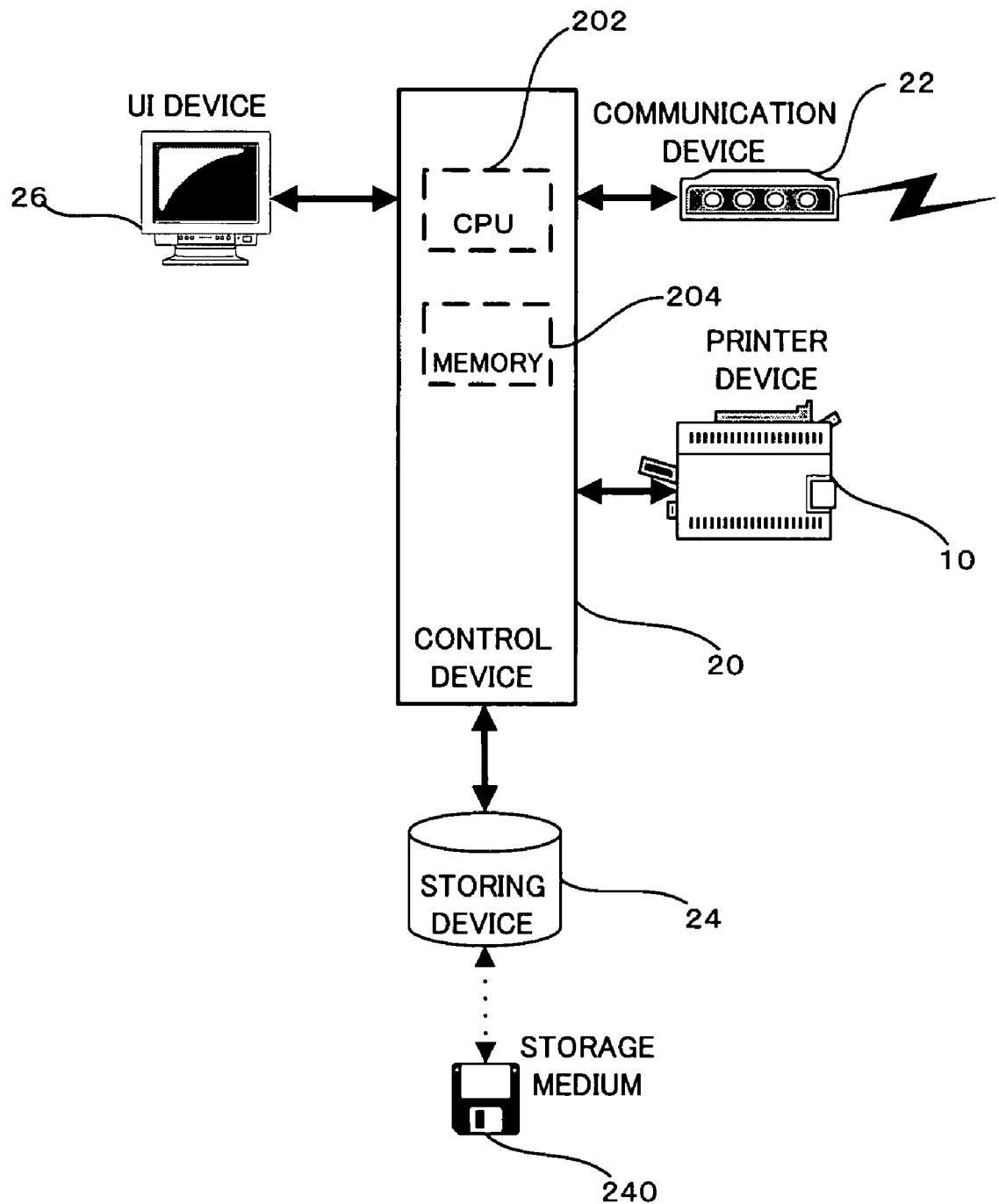
FIG. 2 illustrates a hardware structure of an image processing apparatus 2 to which an encoding method of the exemplary embodiment is applied, a controller 20 being positioned in the center.

FIG. 2 illustrates the hardware structure of the image processing apparatus 2 to which an encoding method of the exemplary embodiment is applied, a controller 20 being positioned in the center.

As illustrated in FIG. 2, the image processing apparatus 2 is composed of the controller 20 including a CPU 202, a memory 204, and other components, a communication device 22, a storing device 24 such as a HDD/CD unit, and a user interface (UI) device 26 including an LCD or CRT display, a keyboard, a touch panel, and the like.

The image processing apparatus 2 is, for example, a processing apparatus provided in conjunction with a printer device 10. The apparatus acquires image data via the communication device 22, the storing device 24, or the like, encodes and stores the acquired image data, decodes the coded data stored, and prints it.

[Encoding Program]

Figure 3:
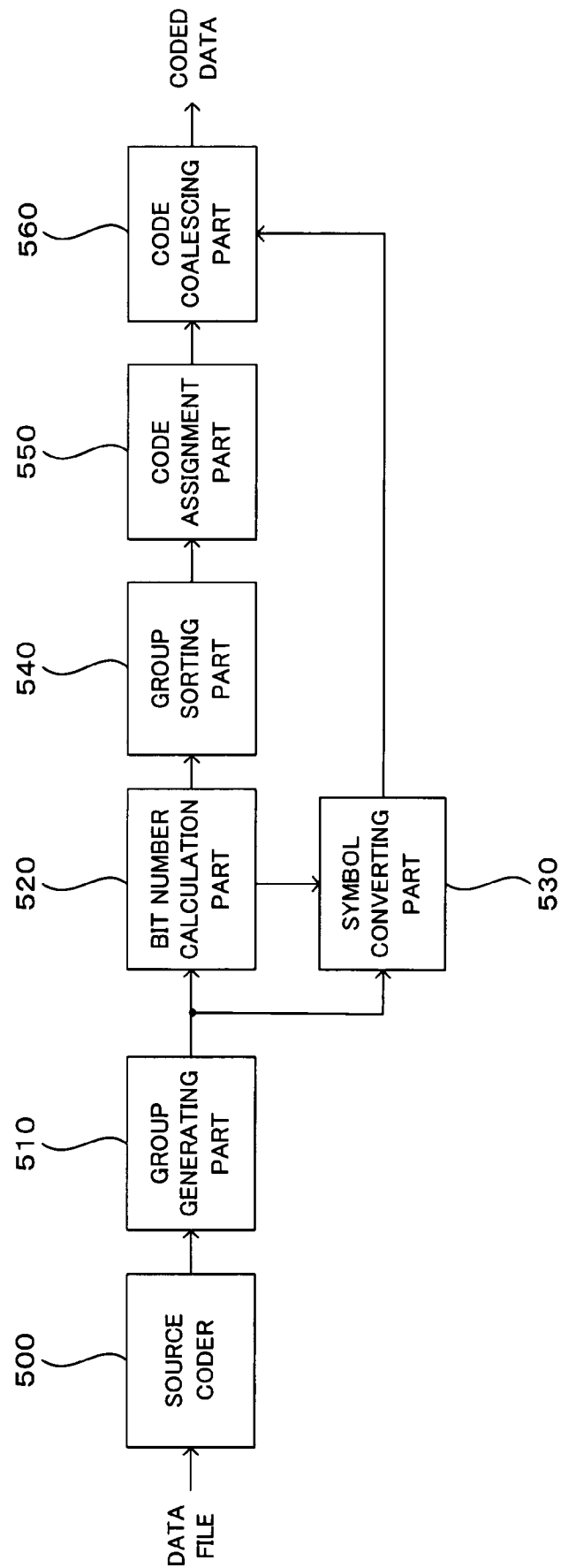
FIG. 3 illustrates a functional structure of an encoding program 5 embodied in a computer readable medium for realizing the encoding method of the exemplary embodiment when executed by the controller 20 (FIG. 2)

FIG. 3 illustrates a functional structure of an encoding program 5 embodied in a computer readable medium for realizing the encoding method of the exemplary embodiment when executed by the controller 20 (FIG. 2).

As illustrated in FIG. 3, the encoding program 5 includes a source coder 500, a group generating part 510, a bit number calculation part 520, a symbol converting part 530, a group sorting part 540, a code assignment part 550, and a code coalescing part 560.

The encoding program 5 is, for example, stored on a storage medium 240 illustrated in FIG. 2 and supplied to the controller 20 (FIG. 2) via this storage medium 240.

In this example, encoding image data is described by way of example.

In the encoding program 5, the source coder 500 generates symbols to be encoded by variable length coding, based on an input data file, and outputs the generated symbols to the group generating part 510.

The source coder 500 of this example predicts a value of a pixel of interest using an established prediction method, calculates a difference between this predicted value and the pixel value of interest (a prediction error value), and creates a symbol corresponding to the calculated prediction error value. Since there is a high correlation between neighboring pixels in image data, it may be expected that symbol values (prediction error values) near 0 appear at high frequency.

The group generating part 510 puts plural symbols input from the source coder 500 together and generates a group (hereinafter termed a block) of the symbols, and outputs the generated symbol block to the bit number calculation part 520 and the symbol converting part 530.

The group generating part 510 of this example puts every predetermined number of symbols input from the source coder 500 together in sequence of input and generates blocks each containing the predetermined number of symbols.

The bit number calculation part 520 calculates the number of bits required to represent a symbol.

When receiving an input of a symbol block from the group generating part 510, the bit number calculation part 520 of this example calculates a minimum number of bits required (the required number of bits) to represent each of the symbols contained in the block and outputs the calculated required number of bits to the group sorting part 540 and the symbol converting part 530.

The symbol converting part 530 converts each of the symbols input from the group generating part 510 into a value represented in a string of bits fewer than the bits of the input symbol and outputs the converted bit string to the code coalescing part 560.

The symbol converting part 530 of this example converts a symbol input from the group generating part 510 into a string of bits as many as the required number of bits for the symbol input from the bit number calculation part 520 (that is, a symbol represented in the required number of bits).

The group sorting part 540 sorts a block (lower-order group) generated by the group generating part 510 to a higher-order group, based on the required numbers of bits respectively representing the symbols in the block, calculated by the bit number calculation part 520.

The group sorting part 540 of this example determines a higher-order group to which to sort a block, based on a combination of the required numbers of bits respectively representing the symbols contained in the block.

The code assignment part 550 assigns a code to a group (block or higher-order group) containing plural symbols.

The code assignment part 550 of this example assigns a Huffman code (hereinafter termed a group code) to each higher-order group, according to the frequency of appearance of the higher-order group (that is, according to the number of the blocks sorted to each higher-order group).

The code assignment part 550 of this example counts the frequency of block appearance per higher-order group and creates a code table based on this counting; however, it may create a code table based on estimated frequency per group or may use a code table which has previously been created according to estimated frequency of appearance.

The code coalescing part 560 generates a code for the symbols contained in a block (hereinafter termed a block code), based on the code assigned by the code assignment part 550 and the bit strings of the symbols generated by the symbol converting part 530.

The code coalescing part 560 of this example coalesces the code (group code) assigned by the code assignment part 550 and the bit strings of the symbol values (symbol values respectively represented in the required numbers of bits) converted by the symbol converting part 530, thus generating a block code.

FIGS. 4A through 4C schematically explain an encoding process by the encoding program 5 (FIG. 3).

As illustrated in FIG. 4A, the group generating part 510 puts every four symbols input from the source coder 500 together in order of input and generates a block containing four symbols S0 to S3. In this example, each of the symbols S0 to S3 corresponds to a prediction error value represented in 8 bits and one block contains 32 bits.

The symbol converting part 530 converts each symbol included in the block to a symbol represented in the required number of bits, as illustrated in FIG. 4B. The number of bits required for symbol representation (the required number of bits) is obtained by adding 1 to the base 2 log of the symbol value. However, a symbol value of 0 is defined to be 0 bit. For example, a symbol value of 1 is represented in one bit, symbol values of 2 and 3 are represented in two bits, and symbol values of 4 to 7 are represented in three bits. In this example, because a source symbol is made up of 8 bits, the required number of bits for a symbol can be determined as one of 9 bits from 0 to 8 bits. For example, given that the required numbers of bits for the symbols in a block are 3, 1, 4, and 1, respectively, the group sorting part 540 of this example sorts the block to a higher-order group based on the combination "3, 1, 4, 1" of the required numbers of bits. Thus, this block is contracted to a higher-order group "3141". A possible number of different higher-order groups is 6561 (=9 raised to the fourth power). The code assignment part 550 measures the probability of block appearance per higher-order group, constructs a Huffman code, and creates a codeword.

To the higher-order group "3141", one of 512 (=8×2×16× 2) blocks may be contracted. To identify each source block, values represented in the required numbers of bits for each symbol are appended following the above codeword. Specifically, as illustrated in FIG. 4C, the code coalescing part 560 coalesces the code assigned to the higher-order group (the codeword for the higher-order group "3141") and the symbol values (represented in the required numbers of bits) contained in the block.

[Coding Operation]

Then, overall operation of the image processing apparatus 2 (encoding program 5) is described.

Figure 5:
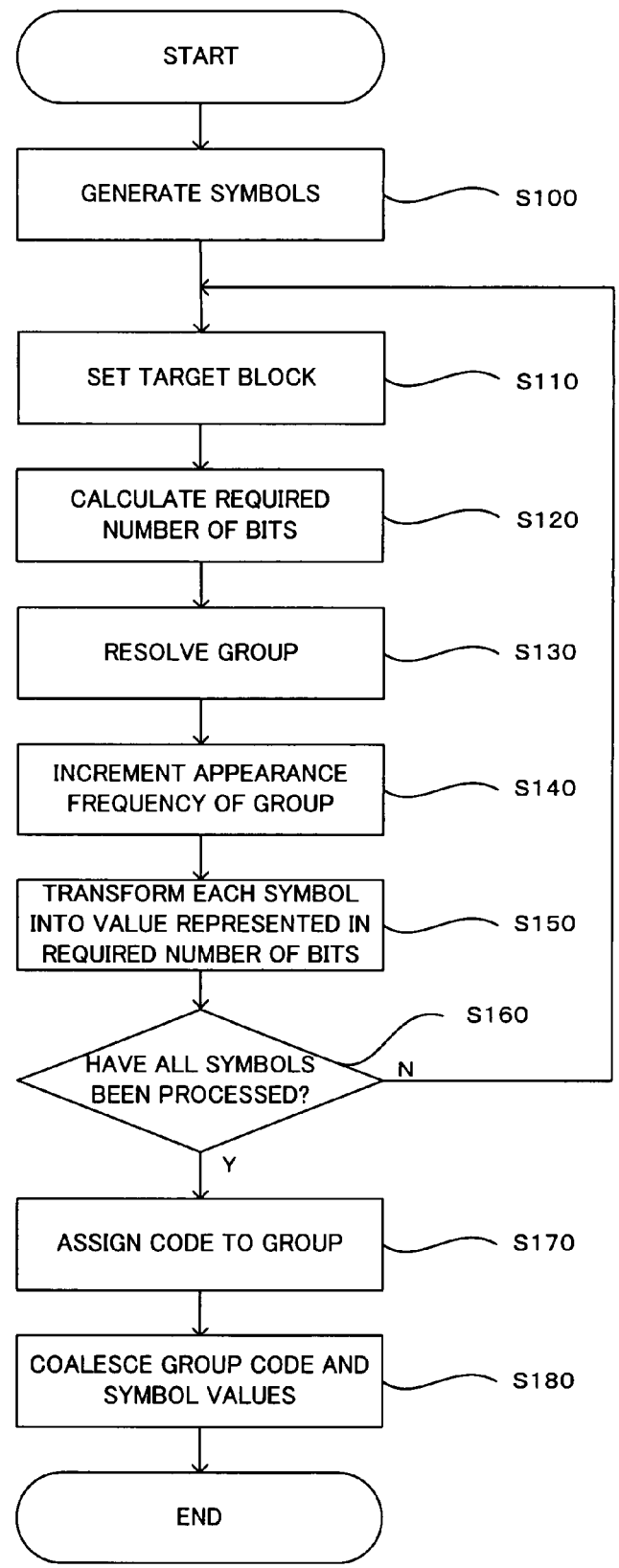
FIG. 5 is a flowchart of an encoding process (S10) by the encoding program 5 (FIG. 3)

FIG. 5 is a flowchart of an encoding process (S10) by the encoding program 5 (FIG. 3).

As illustrated in FIG. 5, at step 100 (S100), when image data is input, the source coder 500 calculates prediction error values in order of scanning and outputs the calculated prediction error values as symbols to the group generating part 510.

The group generating part 510 puts every four symbols (prediction errors) input from the source coder 500 together in order of input, generates a block containing four symbols, and outputs the generated block (lower-order group) to the bit number calculation part 520 and the symbol converting part 530.

At step 110 (S110), the encoding program 5 sets a target block (i.e., the block to be encoded in turn) sequentially out of blocks generated by the group generating part 510.

At step 120 (S120), the bit number calculation part 520 calculates the required number of bits for each of the symbols in the target block input from the group generating part 510 and outputs the calculated required numbers of bits to the group sorting part 540 and the symbol converting part 530. In this example, four required numbers of bits per block are calculated.

At step 130 (S130), the group sorting part 540 sorts the target block to a higher-order group, based on the combination of the required numbers of bits for the symbols of the target block calculated by the bit number calculation part 520.

At step 140 (S140), the code assignment part 550, when notified of the higher-order group to which the target block has just been sorted by the group sorting part 540, increments the appearance frequency count of this higher-order group by one.

At step 150 (S150), the symbol converting part 530 converts the symbols contained in the target block into symbols represented, respectively, in the required numbers of bits calculated by the bit number calculation part 520 and outputs four symbols respectively represented in the required numbers of bits to the code coalescing part 560.

At step 160 (S160), the encoding program 5 determines whether all symbols have been processed. If so, the process proceeds to step S170; if symbols yet to be processed remain, the process returns to step S110.

At step 170 (S170), the code assignment part 550 assigns a Huffman code (group code) to each higher-order group, based on the appearance frequency count of the higher-order group.

At step 180 (S180), the code coalescing part 560 coalesces the Huffman code of the higher-order group to which each block has been sorted and the symbol values (represented in the required numbers of bits) of this block, thus generates a block code, and outputs the generated block code as an output code to the external.

As described above, the image processing apparatus 2 in the present exemplary embodiment generates variable length codes for each block containing plural symbols.

Also, the image processing apparatus 2 sorts plural blocks to a higher-order group and assigns a code to the higher-order group.

Also, the image processing apparatus 2 is capable of independent parallel processing of symbols within a block.

[Decoding Program]

Figure 6:
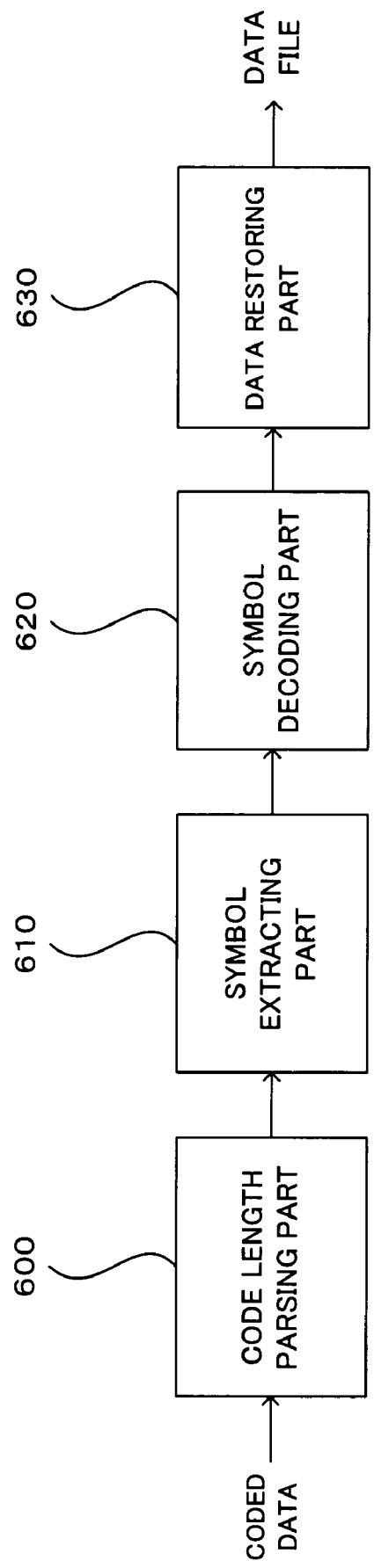
FIG. 6 illustrates a functional structure of a decoding program 6 embodied in a computer readable medium, which is executed by the controller 20 (FIG. 2)

FIG. 6 illustrates a functional structure of a decoding program 6 embodied in a computer readable medium, which is executed by the controller 20 (FIG. 2).

As illustrated in FIG. 6, the decoding program 6 includes a code length parsing part 600, a symbol extracting part 610, a symbol decoding part 620, and a data restoring part 630.

The decoding program 6 is, for example, stored on the storage medium 240 illustrated in FIG. 2 and supplied to the controller 20 (FIG. 2) via this storage medium 240.

In the decoding program 6, the code length parsing part 600 parses the code lengths of the symbols in each block, based on the input coded data.

The code length parsing part 600 of this example parses the number of bits (i.e., the required number of bits) representing each of the symbols contained in a block, based on the code (group code) assigned to the higher-order block and outputs the parsed number of bits to the symbol extracting part 610.

The symbol extracting part 610 extracts each symbol code from the input coded data, based on the code length parsed by the code length parsing part 600.

The symbol extracting part 610 of this example retrieves a bit string representing each of the symbols contained in a block, based on the number of bits for each symbol parsed by the code length parsing part 600.

The symbol decoding part 620 decodes each symbol code extracted by the symbol extracting part 610 and generates each symbol value.

The symbol decoding part 620 of this example prepends a string of 0 bits to the bit string of each symbol (the symbol value represented in the required number of bits) retrieved by the symbol extracting part 610, thus generates symbols of 8-bit representation, and outputs the generated symbols to the data restoring part 630.

The data restoring part 630 restores the data file, based on the symbols decoded by the symbol decoding part 620.

The data restoring part 630 generates the original image data, based on the symbols (prediction error values) input from the symbol decoding part 620.

[Decoding Operation]

Figure 7:
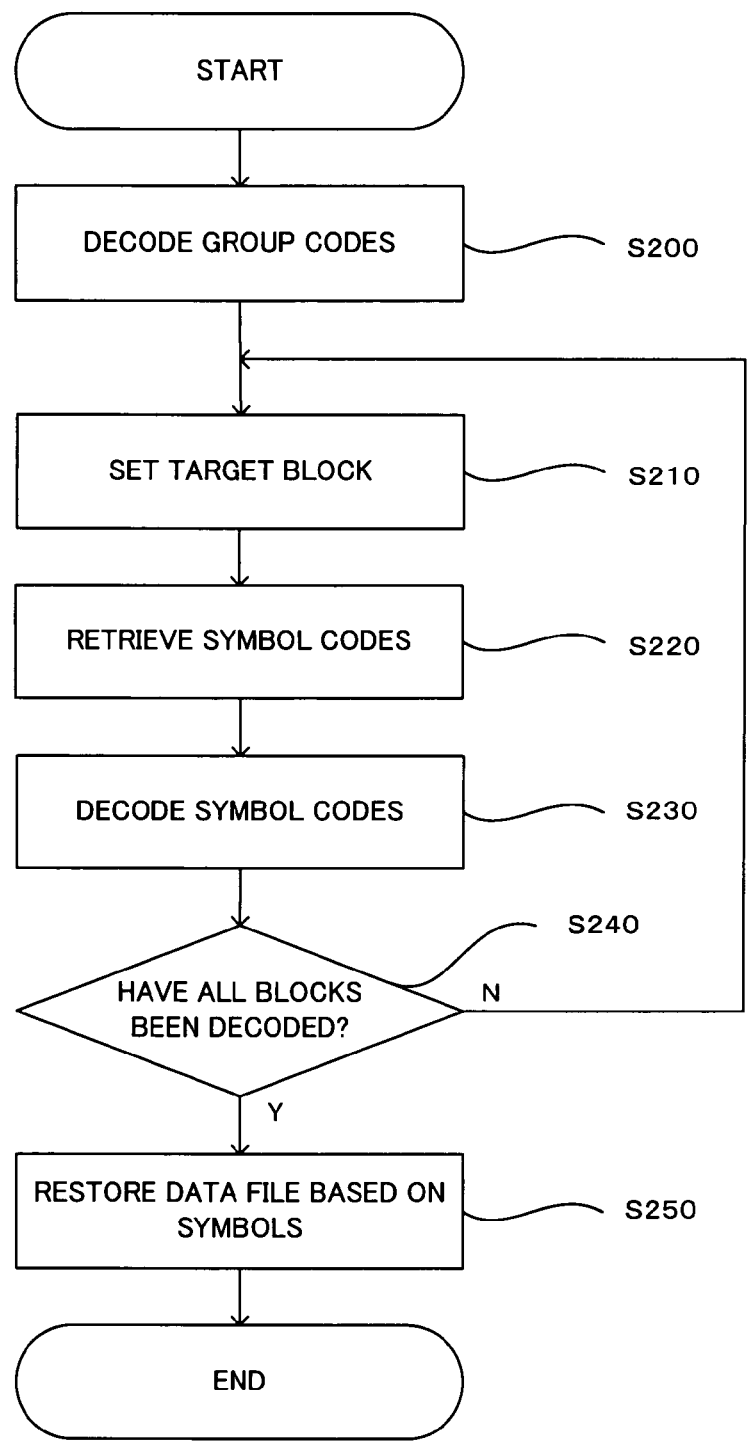
FIG. 7 is a flowchart of a decoding process (S20) by the decoding program 6 (FIG. 6)

FIG. 7 is a flowchart of a decoding process (S20) by the decoding program 6 (FIG. 6).

As illustrated in FIG. 7, at step 200 (S200), the code length parsing part 600 decodes group codes of input coded data and parses the combination of the required numbers of bits in each block.

At step 210 (S210), the decoding program 6 sets a target block code sequentially out of the input coded data.

At step 220 (S220), the symbol extracting part 610 retrieves the bit string of each symbol (i.e., the symbol represented in the required number of bits) out of the bit string of the target block, based on the required number of bits for each symbol parsed by the code length parsing part 600. For example, as illustrated in FIG. 4C, when decoding a group code corresponding to the higher-order group "3141", 3 bits, 1 bit, 4 bits, and 1 bit are retrieved in order from the beginning as the bit strings (codes) of the symbols in the block.

At step 230 (S230), the symbol decoding part 620 adds higher-order bits of 0 to the bit strings of the symbols (respectively represented in the required numbers of bits) retrieved by the symbol extracting part 610, thus generating symbols of 8-bit representation. For example, the symbols (3 bits, 1 bit, 4 bits, and 1 bit) illustrated in FIG. 4B are prepended with bits of 0 and the symbols S0 to S3 illustrated in FIG. 4A are generated.

At step 240 (S240), the decoding program 6 determines whether all blocks have been decoded. If so, the process proceeds to step S250; if symbols yet to be processed remain, the process return to step S210.

At step 250 (S250), the data restoring part 630 generates the original image data, based on the symbols (prediction error values) generated by the symbol decoding part 620.

As described above, the image processing apparatus 2 in the present exemplary embodiment parses the code lengths in each block.

MODIFICATION EXAMPLE 1

Next, a modification example 1 of the above-described exemplary embodiment is described.

In the above-described exemplary embodiment, each block is sorted to a higher-order group, based on the combination of required numbers of bits for the symbols contained in the block, as illustrated in FIGS. 4A through 4C. On the other hand, in the first modification example, each block is sorted to a higher-order group, based on a maximum value among the required numbers of bits for the symbols contained in the block.

Figure 8:
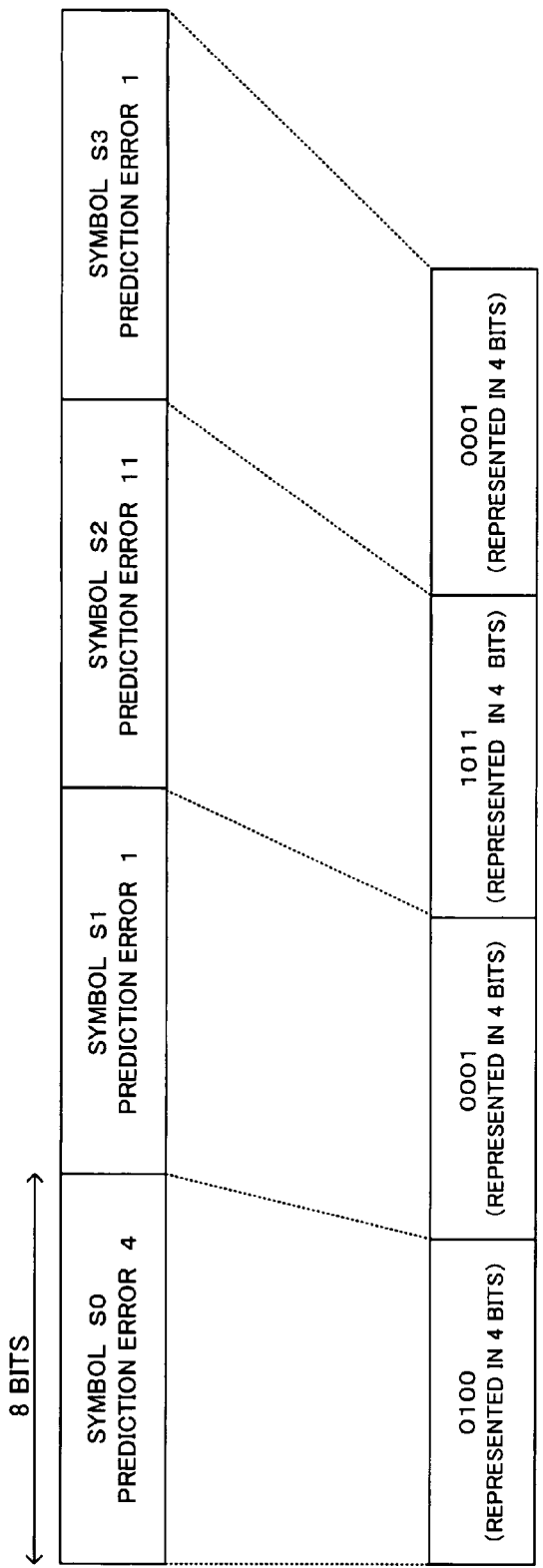
FIGS. 8A, 8B, and 8C schematically explain a manner in which symbols are represented in the bits as many as the required bits for maximum symbol value within a block.

For example, when there are four symbols S0 to S3 contained in a block as illustrated in FIG. 8A, a maximum value among the required numbers of bits to represent these symbols is detected. In this example, the required numbers of bits are three bits for symbol S0 (a prediction error value of 4), one bit for symbol S1 (a prediction error value of 1), four bits for symbol S2 (a prediction error value of 11), and one bit for symbol S3 (a prediction error value of 1). Thus, a maximum value is 4 in this example.

In the present modification example, all symbols within the block are represented in the maximum number of bits; that is, in this example, all the symbols S0 to S3 are represented in four bits, as illustrated in FIG. 8B.

Then, as illustrated in FIG. 8C, the code (group code) assigned to the higher-order block is coalesced with the symbol values represented in the maximum number of bits (in this example, the values of the symbols S0 to S3 represented in four bits) to generate a block code.

Figure 9:
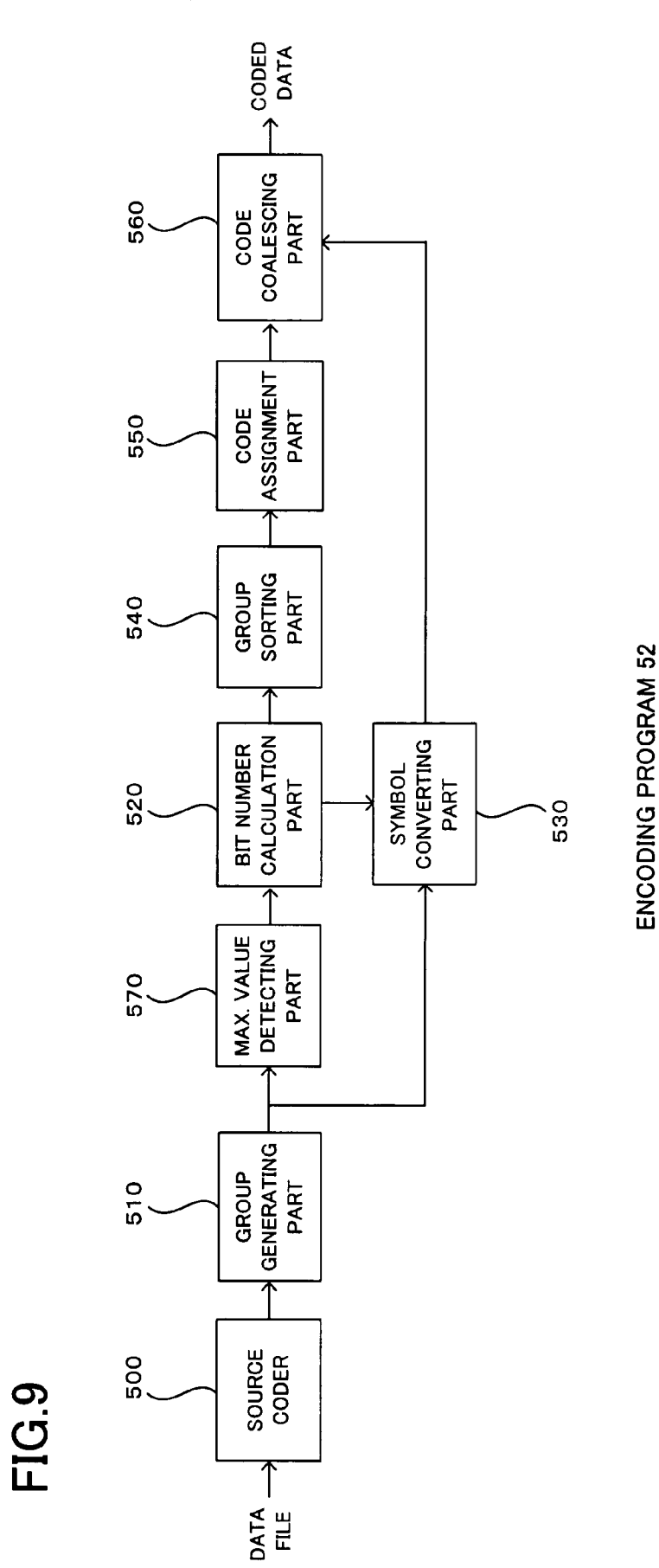
FIG. 9 illustrates a functional structure of a second encoding program 52.

FIG. 9 illustrates a functional structure of a second encoding program 52 embodied in a computer readable medium. Components shown in this figure, which are substantially identical to those shown in FIG. 3, are assigned the same reference numbers.

As illustrated in FIG. 9, the second encoding program 52 is composed of the same components of the encoding program 5 of FIG. 3 and an additional maximum value detecting part 570.

In the encoding program 52, for every block generated, the maximum value detecting part 570 detects a symbol which is represented in the maximum required number of bits from among the symbols contained in the block.

The maximum value detecting part 570 of this example detects a symbol having the maximum symbol value among plural symbols contained in a block.

In the present modification example, the bit number calculation part 520 calculates the required number of bits for the symbol detected by the maximum value detecting part 570.

In the present modification example, the symbol converting part 530 represents all the symbols contained in the block in the required number of bits calculated by the bit number calculation part 520.

In the present modification example, the group sorting part 540 sorts each block to a higher-order group, based on the required number of bits calculated by the bit number calculation part 520 (that is, the required number of bits for the symbol detected by the maximum value detecting part 570).

As described above, by making the code lengths within a block uniform, higher processing speed than the foregoing exemplary embodiment can be accomplished.

If the number of symbols to be contained in a block is set to a multiple of 8, parts represented in the maximum required number of bits are aligned in byte boundaries. Moreover, if Huffman codewords are designed to be aligned in byte boundaries, all codes are aligned in byte boundaries and further speedup can be expected.

A Huffman codeword may be used to represent some blocks together. For example, one byte may be divided into four bits to contain a first block codeword in a string of higher four bits and a second block codeword in a string of lower four bits.

MODIFICATION EXAMPLE 2

In the above-described exemplary embodiment, the symbols in a block are respectively represented in the required numbers of bits, as illustrated in FIG. 10A. On the other hand, in a second modification example, out of the bit string of each symbol represented in the required number of bits, the most significant bit (i.e., the MSB of the symbol) is further removed, as illustrated in FIG. 10B. Specifically, when symbols to be represented in N bits include a bit having the same value, this bit may be removed. For example, when symbol 2 and symbol 3 are represented in two bits, the MSB (Most Significant Bit) of each symbol is 1. Thus, it is not needed to include this bit in the 2-bit representation.

In the second modification example, when N-bit representation is used to represent one particular value of symbols, the N-bit representation may be removed. For example, a symbol value of "1" is represented in one bit as illustrated in FIG. 10A, the 1-bit representation is only used to represent the particular value of "1" of symbols and, therefore, the bits having the symbol value of "1" can be removed, as illustrated in FIG. 10B. This symbol value of "1" can be decoded by decoding "1" in the group code "3141".

MODIFICATION EXAMPLE 3

In the foregoing exemplary embodiment and modification example 1, encoding is performed on an implicit assumption that symbols with smaller values appear at higher frequencies. Particularly when the source coder is provided in the preceding stage, such assumption is quite commonly applied and it is relatively simple to design the source coder to realize this.

However, there may be an exceptional case where the above assumption is not true. Then, as a third modification example, a variant where the symbol values are converted instead of being input directly is described.

In the present modification example, converting the symbol values is performed before calculating the required number of bits for each symbol. This conversion is performed such that symbol values appearing more frequently are assigned smaller index values. This can simply be realized by obtaining the appearance frequencies of symbols by measurement in advance or prediction from other data and preparing a lookup table or the like having the symbol values sorted in order of appearance frequency.

MODIFICATION EXAMPLE 4

As a further modification example which is a variant of the above modification example 3, the encoding process as described in the above modification example 2 (or the exemplary embodiment) is performed in the first path, during which the appearance frequencies of the symbols are measured. Then, if a higher compression ratio is desired, a re-encoding process is further performed, as described in the above modification example 3. Since the amount of coded data to be output after the re-encoding process can be estimated accurately from the measured appearance frequencies of the symbols, it may be determined whether to perform the re-encoding process based on this estimation in some implementation.

OTHER MODIFICATION EXAMPLES

While, in the foregoing exemplary embodiment, the symbol converting part 530 converts symbols on a symbol by symbol basis, this conversion may be performed in units of plural symbols. For example, a lookup table defining combinations of patterns of two succeeding symbols may be created and referenced for the conversion. This implementation may increase the compression ratio of source data to be stored.

While, in the foregoing exemplary embodiment, the source coder 500 calculates prediction error values as symbols, these values may be generated by any other method.

Second Embodiment

Next, a second exemplary embodiment is described.

In the above-described first exemplary embodiment, a required number of bits N within a block is obtained, a group is determined, then respective elements in N-bit representation within the block are merged.

As a result, if the number of generated patterns is small, this process may be performed at a higher speed not by logically performing this process but by holding final data and performing selection using a lookup table (LUT). For example, a Huffman code table may be regarded as a type of such LUT.

However, generally, such table becomes very large when plural symbols are input as in the case of the above exemplary embodiment, therefore this arrangement is often unreasonable. In the above exemplary embodiment, assuming that one block contains eight symbols, when N=1 holds, $(2^1)^8=256$ outputs may occur. Similarly, when N=2 holds, $(2^2)^8=6.6 \times 10^4$ outputs may occur. When N=8 holds, $(2^8)^8=1.8 \times 10^{19}$ outputs may occur. Thus the table has a size which cannot be realized without difficulty by current techniques.

However, when the required number of bits is limited to N=1, the number of entries is 256, accordingly, the LUT may be sufficiently realized. In the second exemplary embodiment, only N=1 input symbols are encoded by a process using the LUT. N=1 holds only for symbols for which the required number of bits is 0 or 1.

Figure 11:
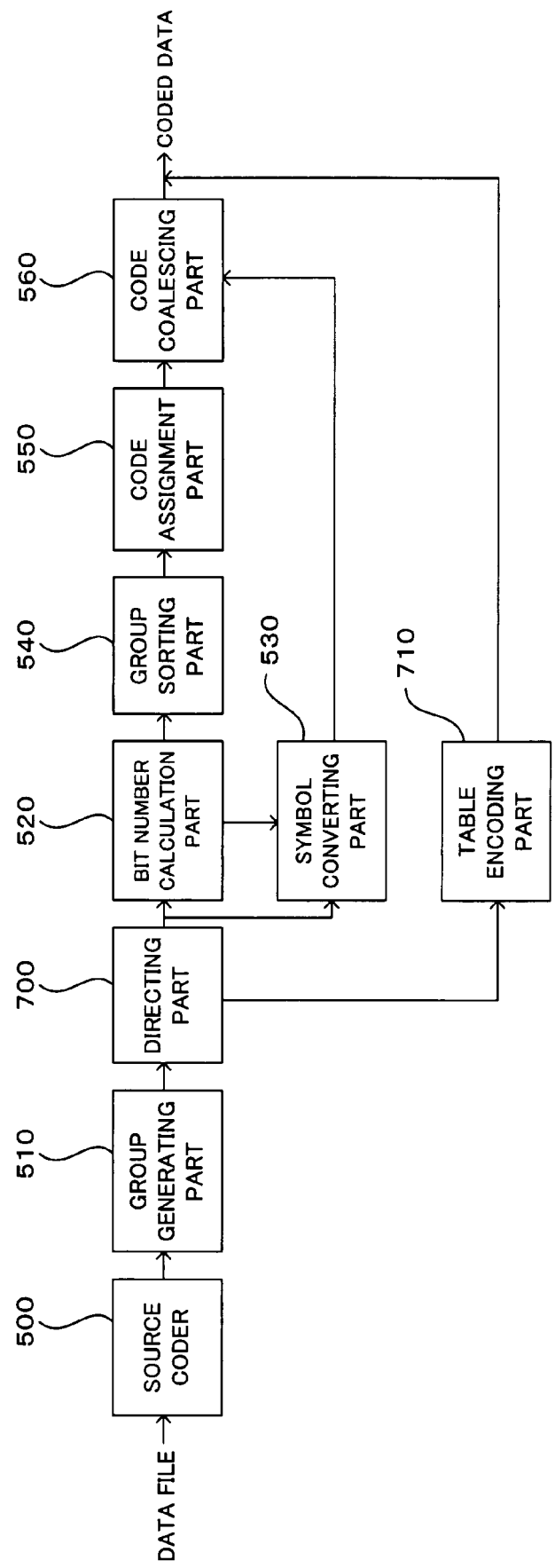
FIG. 11 illustrates a functional structure of the encoding program 7 embodied according to the second exemplary embodiment.

FIG. 11 illustrates a functional structure of an encoding program 7 embodied according to the second exemplary embodiment. Components shown in this figure, which are substantially identical to those shown in FIG. 3, are assigned the same reference numbers.

As illustrated in FIG. 11, the encoding program 7 of the exemplary embodiment is composed of the same components of the encoding program 5 of FIG. 3 with the addition of a directing part 700 and a table encoding part 710.

In the encoding program 7, the directing part 700 outputs every block generated by the group generating part 510 to the bit number calculation part 520 and the symbol converting part 530, or to the table encoding part 710. That is, the directing part 700 is an example of a directing unit according to the present invention. More particularly, when a required number of bits for a block input from the group generating part 510 is a predetermined value, the directing part 700 outputs the block to the table encoding unit 710, otherwise, outputs the block to the bit number calculation part 520 and the symbol converting part 530. The predetermined value in this case means a value equal to or less than, e.g., a reference value. When 8 symbols are contained in one block, the predetermined value is 1 or 2. That is, when the required number of bits is 1 or 2, the block is encoded by the table encoding part 710.

The table encoding part 710 encodes a block input from the directing part 700 using a code table. The code table is a lookup table showing linkage between plural symbols which can be contained in the block and code data of these symbols. That is, the table encoding part 710 of the example reads coded data from the code table based on the symbols of the block input from the directing part 700 and outputs the read coded data to the external.

FIG. 12 illustrates the code table used by the table encoding part 710 in FIG. 11.

FIG. 12 shows a code table in a case where one block contains 8 symbols and N=1 or N=2 holds. Assuming that each symbol is represented in 8 bits, the code table in FIG. 12 may be constructed with $6.6 \times 10^4$ entries. For reference to the code table by the table encoding part 710, a process to retrieve an entry from 8 bit×8 data is required. This may be realized by simple bit manipulation.

In the exemplary embodiment, although a fixed bit process is required upon reference to the code table (LUT) by the table encoding part 710, the processes to refer to a Huffman code table (process by the code assignment part 550 or the like) and to generate a codeword by merging codes while branching between obtained code and code length (process by the code coalescing part 560 or the like) may be removed.

Figure 13:
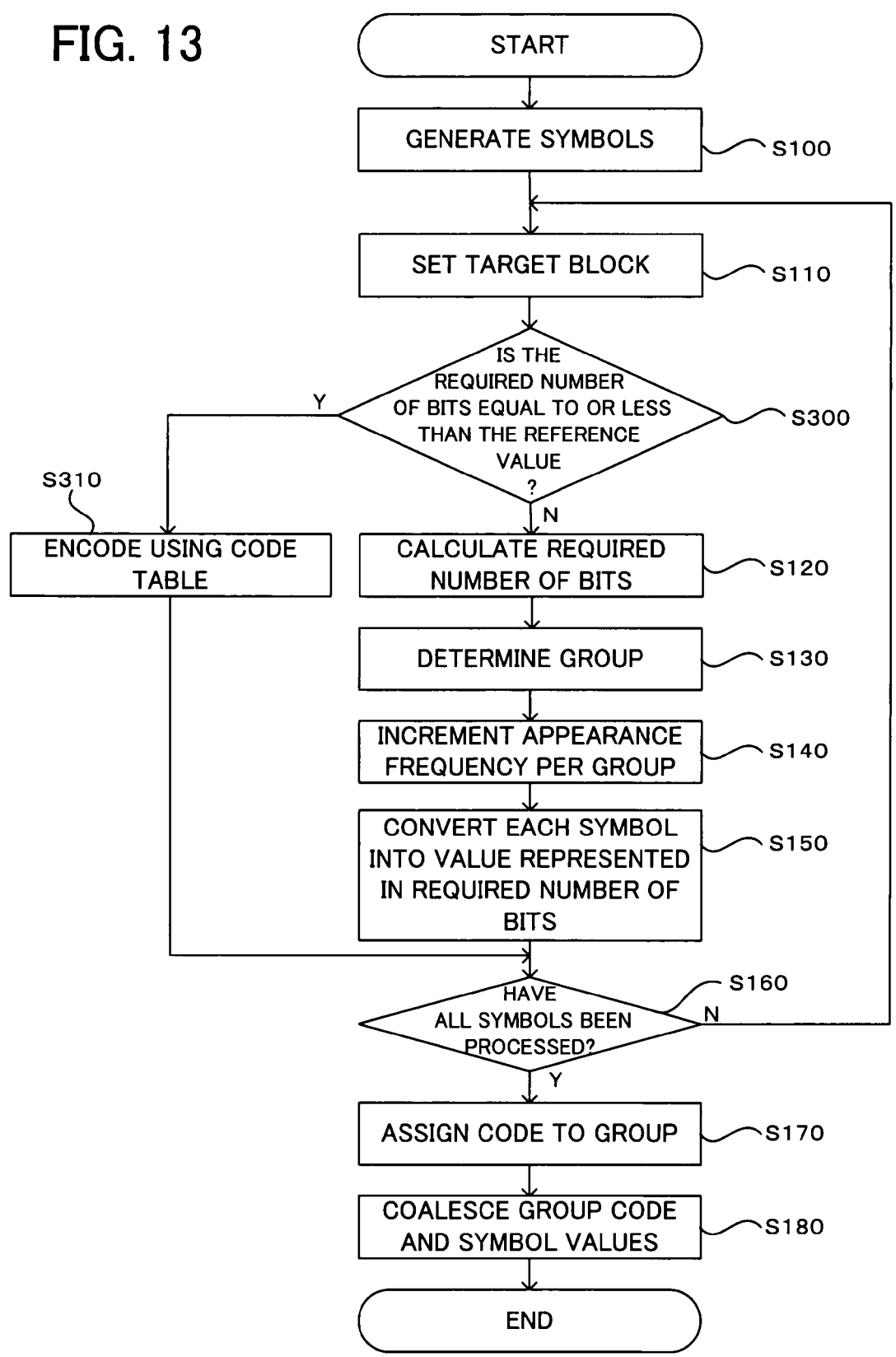
FIG. 13 is a flowchart of an encoding process (S30) by the encoding program 7 (FIG. 11)

FIG. 13 is a flowchart of an encoding process (S30) by the encoding program 7 (FIG. 11). Steps shown in this figure, which are substantially identical to those shown in FIG. 5, are assigned the same reference numbers.

As illustrated in FIG. 13, at step 100 (S100), when image data is input, the source coder 500 calculates prediction error values in order of scanning and outputs the calculated prediction error values as symbols to the group generating part 510. The group generating part 510 puts every eight symbols (prediction errors) input from the source coder 500 together in order of input, generates a block containing eight symbols, and outputs the generated block (lower-order group) to the directing part 700.

At step 110 (S110), the encoding program 7 sets a target block (i.e., the block to be encoded in turn) sequentially out of blocks generated by the group generating part 510.

At step 300 (S300), the directing part 700 determines whether the required number of bits of the target block is equal to or less than a reference value 2. If the required number of bits is equal to or less than the reference value, the directing part 700 outputs the target block to the table encoding part 710. If the required number of bits is greater than the reference value, the directing part 700 outputs the target block to the bit number calculation part 520 and the symbol converting part 530.

If the required number of bits of the target block is equal to or less than the reference value, the encoding program 7 proceeds to step S310, while if the required number of bits of the target block is greater than the reference value, proceeds to step S120.

At step 310 (S310), the table encoding part 710 reads coded data corresponding to the symbols of the target block from the code table illustrated in FIG. 12, and outputs the read coded data to the external.

At step 120, the bit number calculation part 520 calculates the required number of bits for each of the symbols in the target block input from the group generating part 510, and outputs the calculated required numbers of bits to the group sorting part 540 and the symbol converting part 530.

At step 130, the group sorting part 540 sorts the target block to a higher-order group, based on the combination of the required numbers of bits of the target block calculated by the bit number calculation part 520.

At step 140, the code assignment part 550, when notified of the higher-order group to which the target block has just been sorted by the group sorting part 540, increments the appearance frequency count of this higher-order group by one.

At step 150, the symbol converting part 530 converts the symbols contained in the target block into symbols represented in the required numbers of bits calculated by the bit number calculation part 520, and outputs eight symbols represented in the required numbers of bits to the code coalescing part 560.

At step 160, the encoding program 7 determines whether all symbols have been processed. If all symbols have been processed, the process proceeds to step S170. If symbols yet to be processed remain, the process returns to step S110.

At step 170, the code assignment part 550 assigns a Huffman code (group code) to each higher-order group, based on the appearance frequency count of the high-order group.

At step 180, the code coalescing part 560 coalesces the Huffman code of the high-order group to which each block has been sorted and the symbol values (represented in the required numbers of bits) of the block, thus generates a block code, and outputs the generated block code as an output code to the external.

As described above, the image processing apparatus 2 in the exemplary embodiment substitutes the process from step S120 to step S180 with the process at step S310 regarding a block in which the required number of bits is equal to or less than a reference value.

MODIFICATION EXAMPLE

Next, a modification example of the second exemplary embodiment is described.

In the modification example, the above second exemplary embodiment is applied to image compression. In image compression, to reduce redundancy due to data continuity, conversion to a prediction residual such as a preceding value difference is performed.

Figure 14:
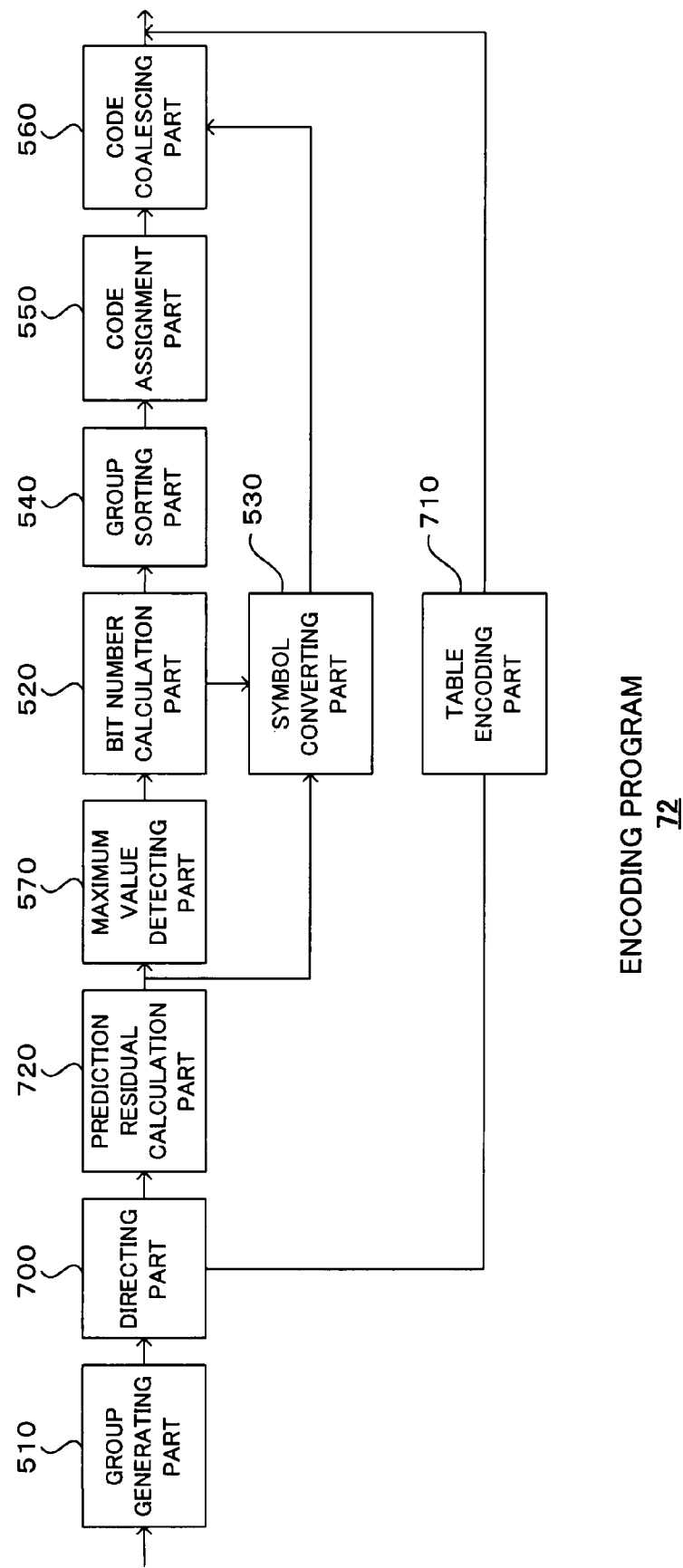
FIG. 14 illustrates a functional structure of the encoding program 72 according to a modification example of this exemplary embodiment.

FIG. 14 illustrates a functional structure of an encoding program 72 embodied according to the modification example. Components shown in this figure, which are substantially identical to those shown in FIG. 9 or 11, are assigned the same reference numbers.

As illustrated in FIG. 14, the encoding program 72 of the modification example is composed of the same components of the encoding program 52 of FIG. 9, excluding the source coder 500, with the addition of the directing part 700, the table encoding part 710 and a prediction residual calculation part 720.

In the encoding program 72, the group generating part 510 puts every eight pixel values from input image data together in order of scanning, and outputs a block containing eight pixel values to the directing part 700.

The directing part 700 determines whether each block input from the group generating part 510 corresponds to a monochrome mode, outputs a block corresponding to the monochrome mode to the table encoding part 710, and outputs a block not corresponding to the monochrome mode to the prediction residual calculation part 720.

In the modification example, the prediction residual is a symbol to be encoded. As the prediction residual may be a positive or negative value, a negative value is represented as a complement of 2. Upon detection of maximum value and calculation of required number of bits, [−1,0] is allocated 1 bit, and [−2,1] is allocated 2 bits, in consideration of appearance frequency. This is a very common technique in signal processing.

The directing part 700 of the example determines whether the current mode is the monochrome mode or not in accordance with an external instruction. In the monochrome mode, an input image is generated with monochrome binary values, or output in monochrome binary values is designated. In the monochrome mode, the value of an image signal is always one of 0 and 255. In this case, the prediction residual is any one of −255, 0 and 255. In consideration of representation using a complement of 2 in 8-bit limitation, the above values are equivalent to 1, 0 and −1. The uniqueness is not lost in this conversion. For example, when a true value is 0 and a predicted value is 255, as a prediction residual is −255, to reproduce the true value from the predicted value and the prediction residual, 255+(−255)=0 holds. Assuming that this residual is represented as 1, when the above expression is substituted with 8-bit limited calculation, 255+1=256 holds. It is understood that in 8-bit limited calculation, i.e., when lower-order 8 bits are taken, 256→0 holds and the true value may be reproduced. This calculation is referred to as "wrap around" and is a general technique.

By use of the wrap around representation, as the prediction residual occurred from 0 or 255 image is represented with 1, 0 and −1, the required number of bits N=1 or 2 holds. That is, in such case, the LUT process is possible. Accordingly, the directing part 700 of the modification example selects an LUT (i.e., the process by the table encoding part 710) when the monochrome mode is selected.

The directing part 700 may analyze an input image and detect a monochrome binary image, or may actually calculate a prediction residual and pass the input image through the LUT only when N=1 or 2 holds. In this case, the processes may be reduced by first performing the prediction residual calculation in the subsequent stage.

The prediction residual calculation part 720 calculates a difference between a pixel value of a pixel of interest and its immediately-preceding pixel value, and outputs the calculated difference (i.e., prediction residual) to the symbol converting part 530 and the maximum value detecting part 570.

In the above arrangement, as the number of processes which can be reduced by use of code table (LUT) may be increased.

In the above modification example, as the required number of bits, N=1 or N=2 holds. However, N=1, N=2 and N=3 hold, or other number may be employed as long as the process can be realized.

The present invention may be embodied in other specific forms without departing from its spirit or essential characteristics. The described exemplary embodiment is to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed is:

1. An encoding apparatus comprising:
    a group generating unit that puts a plurality of information values to be compressed together and generates a lower-order group of information values to be compressed;
    a group sorting unit that sorts the lower-order group generated by the group generating unit to a higher-order group;

a code assignment unit that assigns a code to each higher-order group sorted by the group sorting unit; and an information encoding unit that encodes the information values to be compressed belonging to each lower-order group belonging to the same higher-order group, using a variable length code assigned to the higher-order group.

2. The encoding apparatus according to claim 1, wherein the group generating unit puts every predetermined number of information values to be compressed which have been input together in order of input and generates a lower-order group containing the predetermined number of information values to be compressed; and the group sorting unit sorts the lower-order group to a higher-order group, based on the numbers of bits to represent, respectively, the information values to be compressed belonging to the lower-order group.

3. The encoding apparatus according to claim 1, wherein the code assignment unit assigns an entropy code to each group, according to the probability of appearance of each group.

4. The encoding apparatus according to claim 1, further comprising:

an information converting unit that converts each of input information values to be compressed to a value represented in a string of bits fewer than the bits of the original information value to be compressed;

wherein the information encoding unit encodes the information values to be compressed belonging to each group, using bit strings converted by the information converting unit and a code assigned to the group.

5. The encoding apparatus according to claim 1, further comprising:

a table-use encoding unit that encodes the group of information values to be compressed using a code table showing linkage between a plurality of information values which can be contained in the group and code data of these information values; and a directing unit that directs the group of information values generated by the group generating unit to a combination of the code assignment unit and the information encoding unit, or to the table-use encoding unit;

wherein the code assignment unit assigns a code to the group directed by the directing unit, and the compressed information encoding unit encodes the information values of the group directed by the directing unit.

6. A decoding apparatus, comprising:

a code length parsing unit that, for a group including a plurality of compressed information values, parses code length of each of the compressed information values belonging to the group, based on a code assigned to the group; and a compressed information decoding unit that decodes the compressed information values belonging to the group, based on the code length of each compressed information value parsed by the code length parsing unit.

7. An encoding method comprising:

putting a plurality of information values to be compressed together and generating a lower-order group of information values to be compressed;

sorting the lower-order group generated to a higher-order group;

assigning a code to each sorted higher-order group; and encoding the information values to be compressed belonging to each lower-order group belonging to the same higher-order group, using a variable length code assigned to the higher-order group.

8. A computer readable medium storing a program causing a computer to perform the following:

putting a plurality of information values to be compressed together and generating a lower-order group of information values to be compressed;

sorting the lower-order group generated to a higher-order group;

assigning a code to each sorted higher-order group; and encoding the information values to be compressed belonging to each lower-order group belonging to the same higher-order group, using a variable length code assigned to the higher-order group.

9. A computer data signal embodied in a carrier wave for enabling a computer to perform a process for encoding, the process comprising:

putting a plurality of information values to be compressed together and generating a lower-order group of information values to be compressed;

sorting the lower-order group generated to a higher-order group;

assigning a code to each sorted higher-order group; and encoding the information values to be compressed belonging to each lower-order group belonging to the same higher-order group, using a variable length code assigned to the higher-order group.

* * * * *